(12) United States Patent
Vittu

(10) Patent No.: US 7,078,799 B2
(45) Date of Patent: Jul. 18, 2006

(54) SEMICONDUCTOR PACKAGE

(75) Inventor: Julien Vittu, Saint Marcellin (FR)

(73) Assignee: STMicroelectronics S.A. (FR)

( * ) Notice: Subject to any disclaimer, the term of this patent is extended or adjusted under 35 U.S.C. 154(b) by 97 days.

(21) Appl. No.: 10/827,610

(22) Filed: Apr. 19, 2004

(65) Prior Publication Data

US 2005/0046010 A1 Mar. 3, 2005

(30) Foreign Application Priority Data

Apr. 29, 2003 (FR) .................................. 03 05264

(51) Int. Cl.
*H01L 23/12* (2006.01)
(52) U.S. Cl. ...................................... 257/704; 257/433
(58) Field of Classification Search ................. 257/704
See application file for complete search history.

(56) References Cited

U.S. PATENT DOCUMENTS

| | | | | |
|---|---|---|---|---|
| 4,918,513 A | * | 4/1990 | Kurose et al. ................. 439/73 |
| 5,274,456 A | * | 12/1993 | Izumi et al. ................. 348/335 |
| 5,753,857 A | * | 5/1998 | Choi ......................... 174/52.4 |
| 5,789,804 A | | 8/1998 | Matsuoka |
| 2001/0036771 A1 | * | 11/2001 | Farnworth et al. .......... 439/632 |
| 2002/0057468 A1 | | 5/2002 | Masao |
| 2002/0131782 A1 | * | 9/2002 | Yamaguchi et al. ......... 396/429 |

FOREIGN PATENT DOCUMENTS

| | | |
|---|---|---|
| FR | 2 822 326 | 9/2002 |
| WO | WO 01/91193 | 11/2001 |

OTHER PUBLICATIONS

Preliminary French Search Report, FR 03 05264, Oct. 1, 2003.

* cited by examiner

*Primary Examiner*—Tu-Tu Ho
(74) *Attorney, Agent, or Firm*—Jenkens & Gilchrist, P.C.

(57) ABSTRACT

A semiconductor package includes a body having a cavity closed by a lid. In the cavity, an integrated-circuit chip is placed. Electrical connection leads are carried by the body. These leads have resilient inner terminal parts which lie in the cavity and are suitable for being in contact with electrical connection pads on the said chip. The lid acts so as to keep the said inner terminal parts of the leads in resilient contact on the electrical connection pads on the chip.

23 Claims, 7 Drawing Sheets

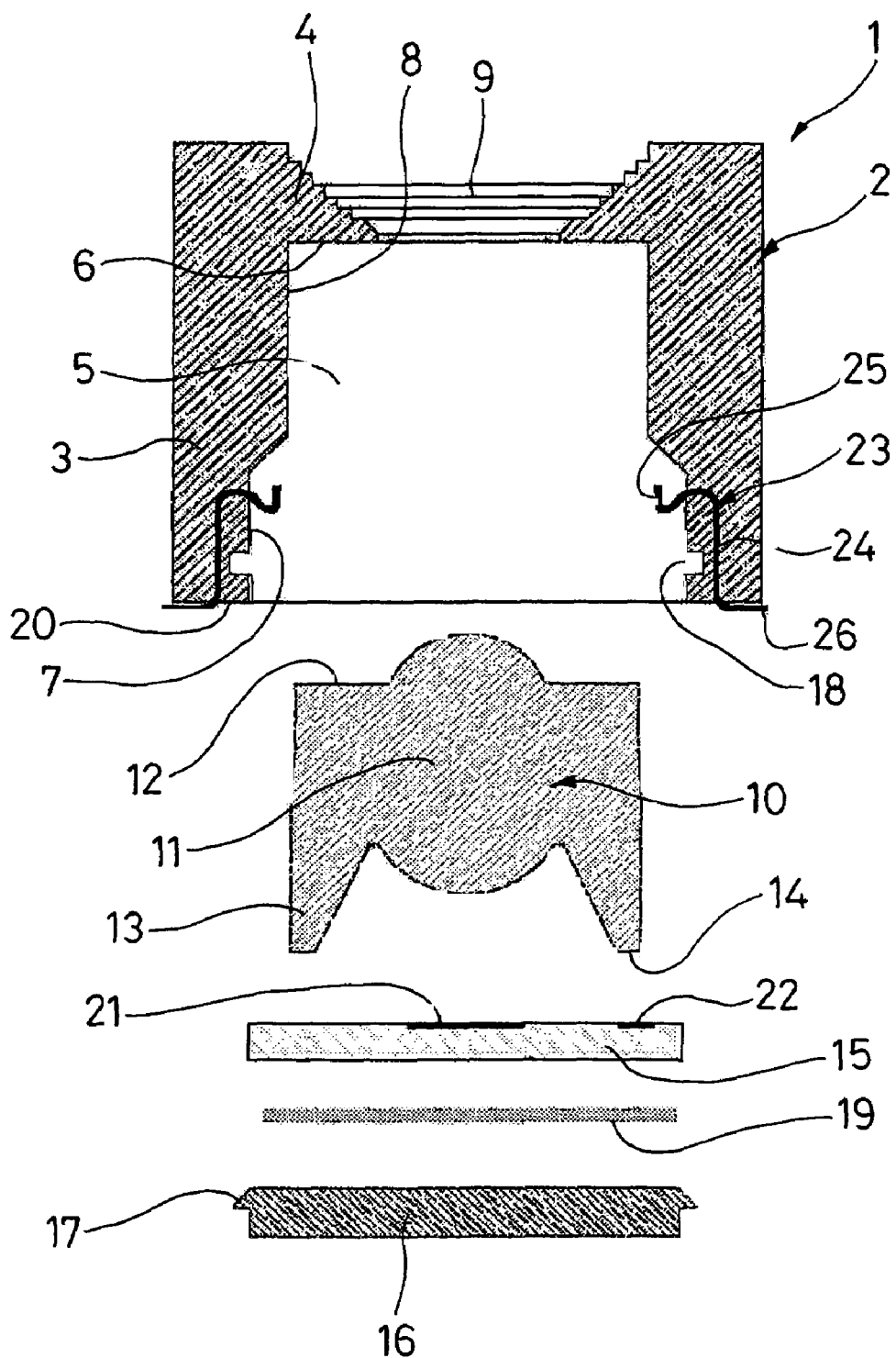
FIG_1

FIG_2
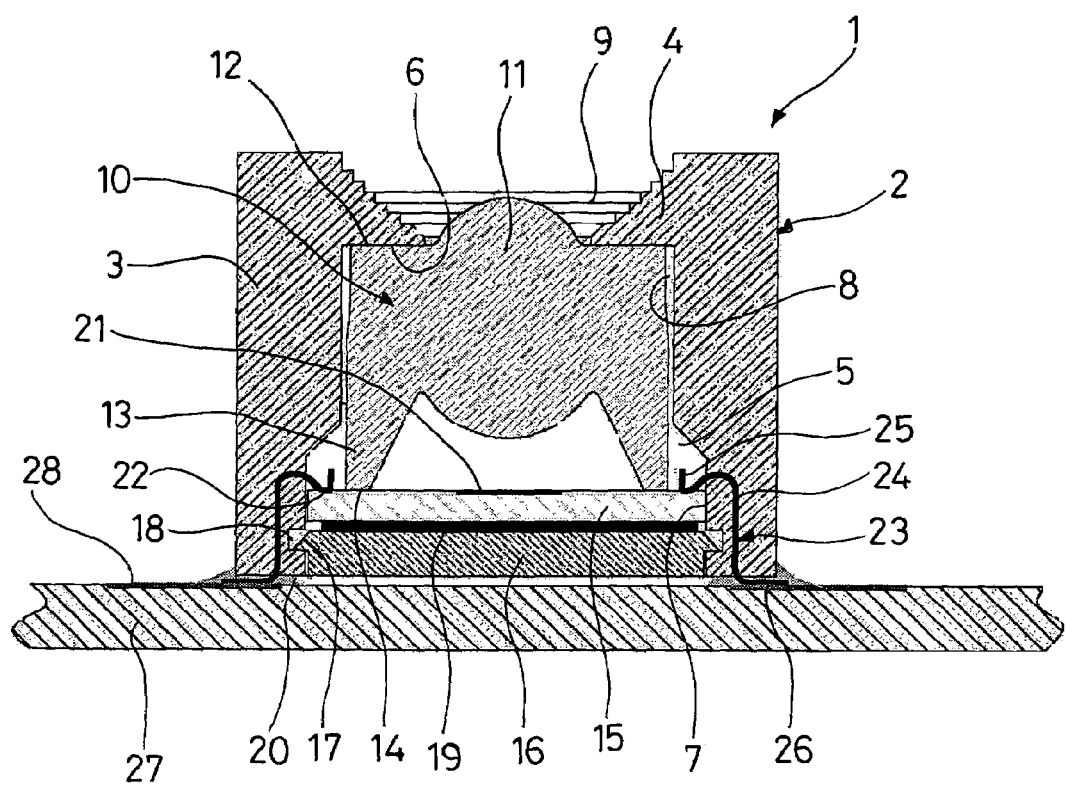

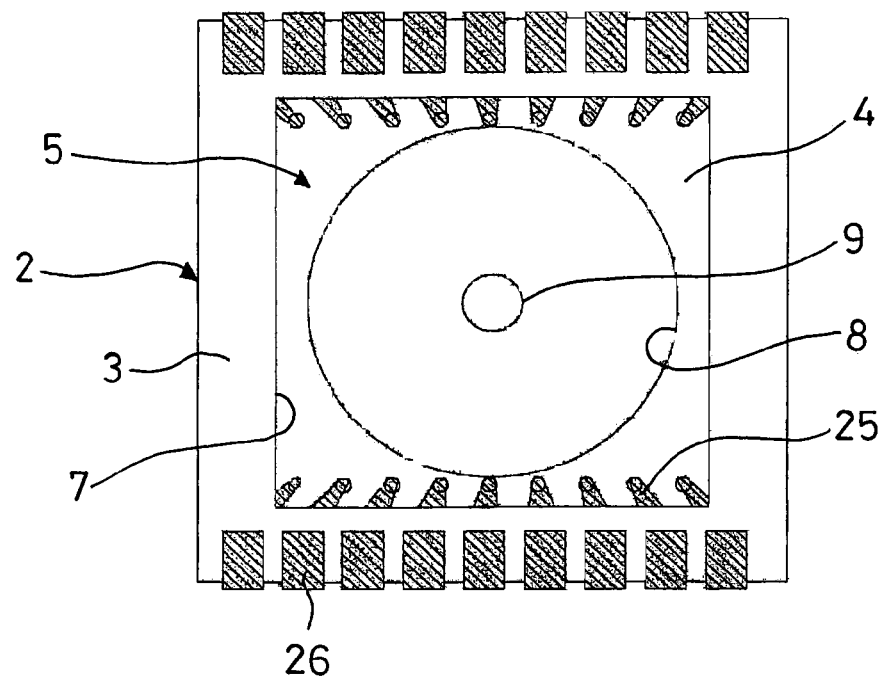
FIG_3
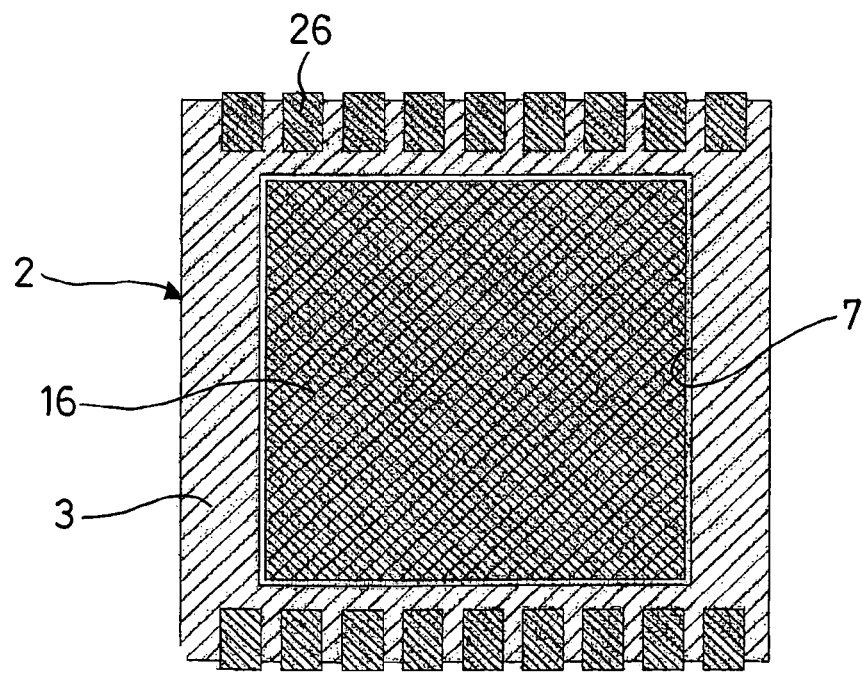
FIG_4

FIG_5
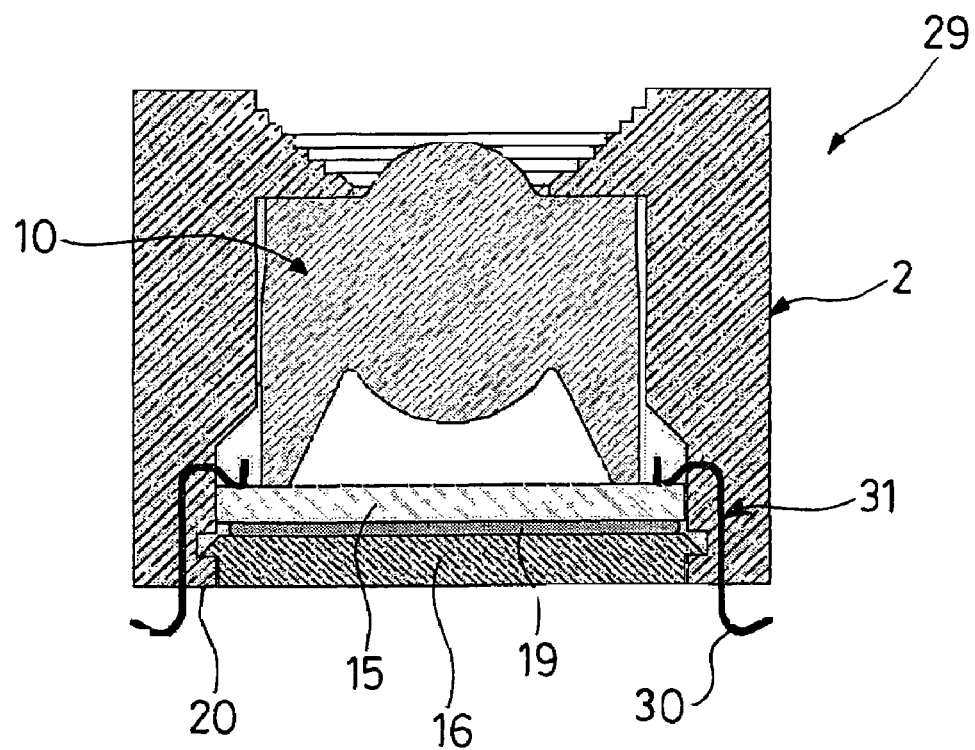

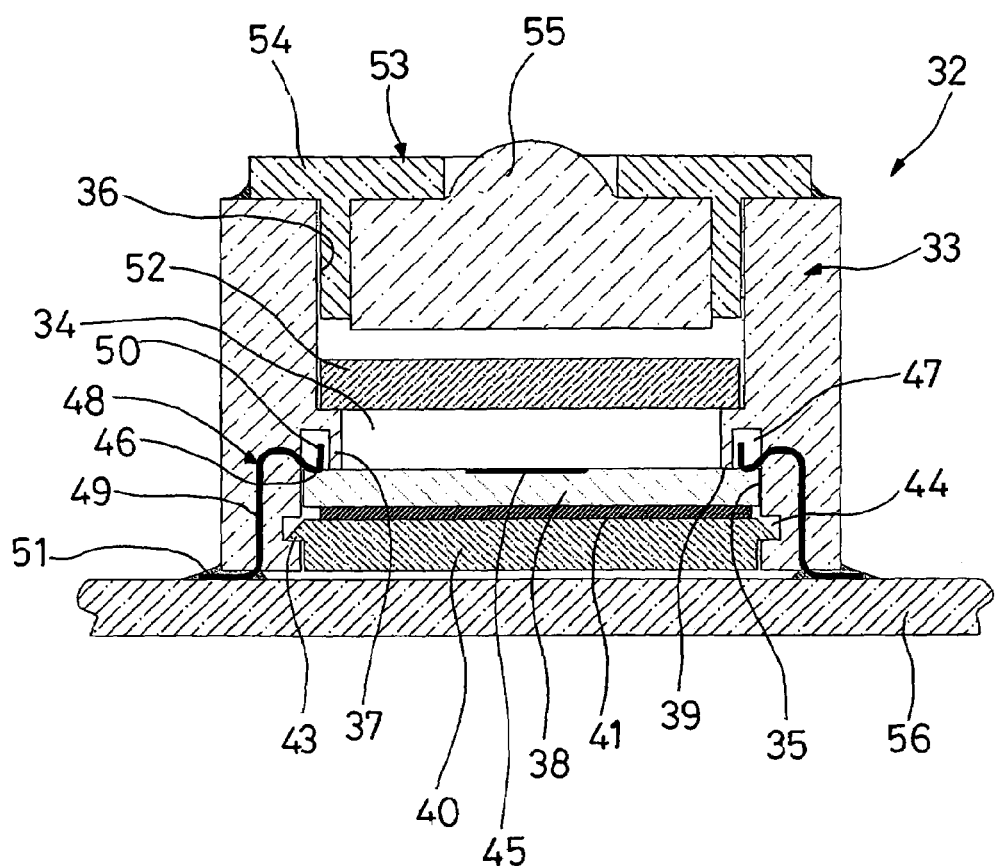

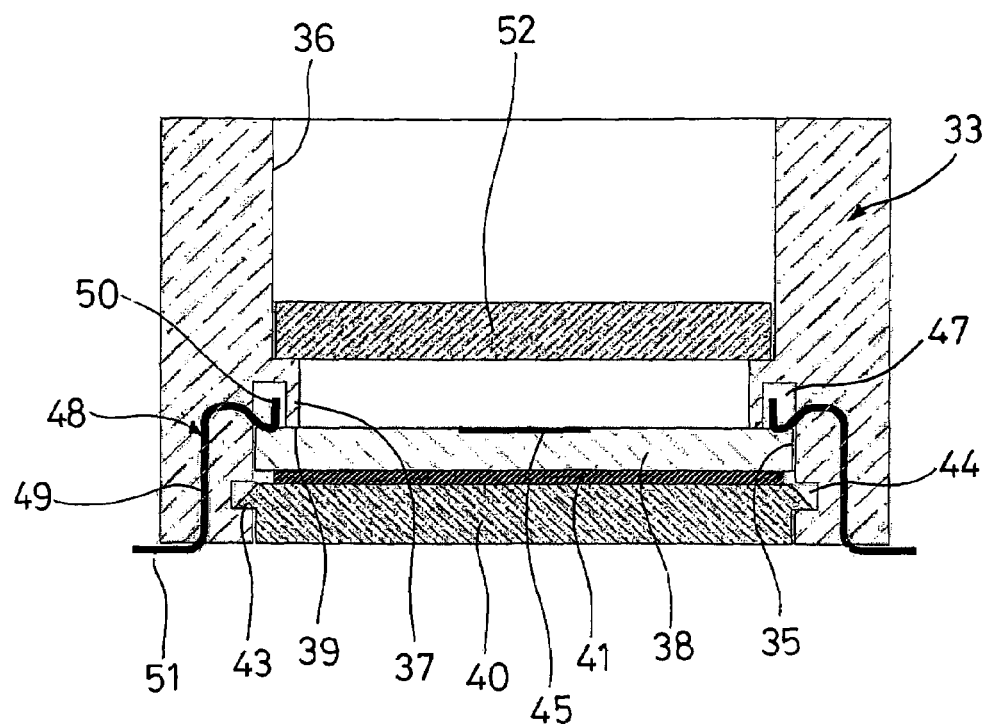
FIG_7

FIG_8
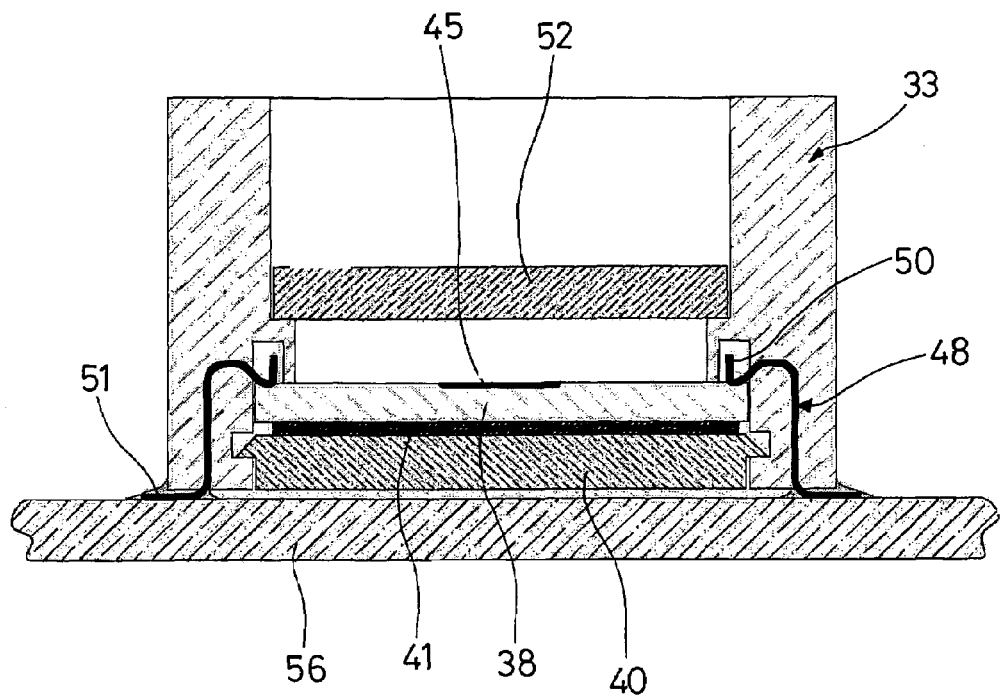

SEMICONDUCTOR PACKAGE

PRIORITY CLAIM

The present application claims priority from French Application for Patent No. 03 05264 filed Apr. 30, 2003, the disclosure of which is hereby incorporated by reference.

BACKGROUND OF THE INVENTION

1. Technical Field of the Invention

The present invention relates to the field of semiconductor packages containing an integrated circuit chip.

2. Description of Related Art

To produce certain known semiconductor packages, the following successive operations are carried out. A body is produced, which comprises a rear electrical connection plate and an annular wall extending towards a front of the package so as to constitute a cavity. An integrated circuit chip is then placed in this cavity and fixed to the plate. Front electrical connection pads on the chip are electrically connected to front electrical connection regions of the plate via electrical connection wires. The cavity is then closed by means of a front lid.

There is a need in the art for a semiconductor package whose structure and fabrication are simplified in view of the known prior art.

SUMMARY OF THE INVENTION

In accordance with one embodiment of the invention, a semiconductor package comprises a body having a cavity which may be closed by a lid. An integrated circuit chip is placed within the cavity. Electrical connection leads carried by the body have resilient inner terminal parts which lie in the cavity and are suitable for being in contact with electrical connection pads on the chip. The lid, when closing the cavity, acts so as to keep the inner terminal parts of the leads in resilient contact with the electrical connection pads on the chip.

The lid preferably acts on an opposite face of the chip from the face having the electrical connection pads of this chip.

A resilient means may be interposed between the lid and the chip.

The package may include a travel limitation means acting on the chip on the opposite side from the lid. This travel limitation means may consist of part of the body. This travel limitation means may alternatively consist of a separate part in the said cavity of the said body.

According to one embodiment, the chip may advantageously have an optical sensor and the body have a passage located facing this optical sensor. An optical device is placed facing this optical sensor and located in the said cavity. The optical device and the chip may be stacked between a surface of the cavity and the lid. The optical device may be engaged in the cavity via its opening on the opposite side from the lid. A transparent plate may be placed between the optical device and the chip.

According to an embodiment, the electrical connection leads preferably have outer terminal parts that lie outside the body. The outer terminal parts of the electrical connection leads may lie towards the rear relative to the face of the body.

According to an embodiment, the electrical connection leads preferably have a part that passes through the wall of the body.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows an exploded cross section of a semiconductor package according to the present invention;

FIG. 2 shows a cross section of the semiconductor package of FIG. 1, in the assembled state;

FIG. 3 shows a rear view of the body of the aforementioned package;

FIG. 4 shows a rear view of the aforementioned package, in the assembled state;

FIG. 5 shows a cross section of a semiconductor package constituting a variant of the aforementioned package;

FIG. 6 shows a cross section of another semiconductor package according to the present invention;

FIG. 7 shows a cross section of the semiconductor package of FIG. 4 in a first fabrication step; and FIG. 8 shows a cross section of the semiconductor package of FIG. 4 in a second fabrication step.

DETAILED DESCRIPTION OF THE DRAWINGS

FIGS. 1 to 4 show a semiconductor package 1 that comprises a package body 2 of parallelepipedal shape and square cross section. The package body 2 has an annular wall 3 and a front wall 4 so as to define a cavity 5 open to the rear. Between its rear opening and its top 6, the cavity 5 has, axially, a rear part 7 of square cross section and a front part 8 of circular cross section, the diameter of which is smaller than the sides of the rear part 7.

Provided through the front wall 4 of the package body 2 is a through-passage 9 open to the front and emerging to the rear in the cavity 5. A one-piece cylindrical lens body 10 whose central part constitutes a lens is engaged via the rear in the cavity 5. The lens body has a front annular surface 12 bearing against the inner surface 6 of the front wall 4, constituting the top of the cavity 5. The lens body 10 has a rear annular peripheral shoulder 13 whose rear annular surface 14 lies inside the rear part 7 of the cavity 5.

Also engaged in the rear part 7 of the cavity 5 is a square integrated-circuit chip 15. The front face of the chip 15 bears on the rear surface 14 of the lens body 10. A square lid 16 closes the cavity and a washer 19 made of elastic material, for example rubber, is interposed between the rear face of the chip 15 and the front face of lid 16. The lid 16 has peripheral ribs 17 in the form of retention hooks engaged in internal retention grooves 18 made in the wall 3 of the package body 2, around the periphery of the cavity 5.

Thus, the lens body 10, the chip 15, the resilient washer 19 and the lid 16 constitute a stack between the top 6 of the cavity 5 of the body 2 and the rear face 20 of the annular wall 3 of this body. This stack is held axially in place by the peripheral hooks 17 of the lid 16 that are engaged in the grooves 18 in the wall 3 of the body 2 and the resilient effect of the washer 19. The lens body 10 is held transversely in the front part 8 of the cavity 5 and the chip 15, the washer 19 and the lid 16 are held transversely in the rear part 7 of this cavity 5.

The chip 15 has, on the central part of its front face, an integrated optical sensor 21, which thus lies facing the central lens 11 of the lens body 10. The chip 15 also has, around the periphery of its front face, a multiplicity of electrical connection pads 22 located to the outside of the annular shoulder 13 of the lens body 10.

The annular wall 3 of the package body 2 carries a multiplicity of electrical connection leads 23 which are spaced apart peripherally. Each of these leads 23 has a part 24, embedded in the material, which is extended by an inner terminal part 25 lying in the rear part 7 of the cavity 5 in front of the chip 15. This part 25 is positioned outside the shoulder 13 of the lens body 10. An outer terminal part 26 of each lead 23 extends rearwards from the rear face 20 of the wall 3 of the body 2.

The inner terminal parts 25 of electrical connection leads 23 are curved so as to be in the form of pin heads and are in resilient contact with the electrical connection pads 22 on the chip 15. The outer terminal parts 26 of electrical connection leads 23 are bent so as to be flat beneath the rear face 20 of the package body 2.

The semiconductor device 1 may be fabricated in the following manner.

First, the package body 2, which is preferably made of a plastic, is fabricated in an injection-moulding mould. The electrical connection leads 23 are placed beforehand in the cavity of the mould so that the central part 24 of these leads is embedded in the material.

Next, the lens body 10, the chip 15, the resilient washer 19 and the lid 16 are stacked in the cavity 5 of the body 2 and compressed until, owing to the effect of pressure, the hooks 17 of the rear lid 16 lock into the grooves 18 of the body 2. Having done this, the inner terminal parts 25 of the leads 23 are pushed up elastically towards the front and remain in resilient contact with the pads 22 on the chip 15.

After this, the semiconductor package 1 is mounted on and fastened to a printed-circuit board 27 in such a way that the outer terminal parts 26 of the electrical connection leads 23 are electrically connected or soldered to electrical connection tracks 28 made on a front face of this board 27.

FIG. 5 shows a semiconductor package 29 that differs from the semiconductor package 1 described above only by the fact that the outer terminal parts 30 of its electrical connection leads 31 extend rearwards from the rear face 20 of the package body 2, forming pin heads. Thus, in an alternative mounting arrangement, these terminal parts 30 may bear elastically on electrical connection tracks of a printed-circuit board.

FIG. 6 shows a semiconductor package 32 that differs from that described with reference to the previous figures by the fact that it includes an annular body 33, of square perimeter, in which an axial cavity 34 is provided. This axial cavity 34 has a rear part 35 of square cross section and a front part 36 of circular cross section. These parts are separated by an annular shoulder 37 that projects inwards.

In this example, a square integrated-circuit chip 38 is engaged in the rear part 35 of the cavity 34 and its front face bears against a rear face 39 of the internal shoulder 37. As in the previous example, a rear lid 40 closes the rear part 35 of the cavity 34 and bears against the rear face of the chip 38 via a resilient washer 41, this lid 40 having peripheral rims 43 constituting hooks engaged in internal grooves 44 made in the body 33, in the wall of the rear part 35 of the cavity 34.

The chip 38 has, in the central part of its front face, an integrated optical sensor 45 and, around the periphery of this front face, electrical connection pads 46, the internal shoulder 37 having an annular recess 47 that exposes its pads 46 in such a way that its rear face 39 bears on the front face of the chip 38 between the optical sensor 45 and the pads 46.

As in the previous example, the package body 33 carries electrical connection leads 48 which have central parts 49 embedded in the material, inner terminal parts 50 which emerge in the recess 47 of the rear part 35 of the cavity 34 and which are bent or curved in the form of pin heads so as to be in resilient contact with the pads 39 on the chip 38, and also outer terminal parts 51 which extend rearwards from the rear face of the package body 33.

The semiconductor package 32 furthermore includes a transparent plate 52 engaged in the front part 36 of the cavity 35 and fastened, for example, by adhesive bonding to the front face of the internal shoulder 37, and also an optical device 53, constituting a front lid, which comprises an annular lens holder 54 engaged in the front part 36 of the cavity 34, in front of the transparent plate 52. This lens holder 54 carries, in its central passage, a lens 55 thus placed facing the optical sensor 45 of the chip 38.

Thus assembled, the semiconductor package 32 may be fastened directly, as in the example described with reference to FIGS. 1 to 4, to a printed-circuit board 56 so as to electrically connect the rear terminal parts 51 of the electrical connection leads 48 to connection tracks on this board.

In a variant, the semiconductor package 32 could be assembled in the following manner, especially if the material constituting the lens 55 would be unable to withstand the operations of soldering the electrical connection leads onto the printed-circuit board 56.

As shown in FIG. 7, first a semiconductor package 32 is partially produced by installing, in the rear part 35 of the cavity 34 of the prefabricated package body 33 (which includes the electrical connection leads 48), the chip 38, the resilient washer 41 and the lid 40.

Next, as shown in FIG. 8, this subassembly may be fastened to the printed-circuit board 55 by connecting the outer terminal parts 51 of the electrical connection leads 48 to the tracks of the printed-circuit board 56.

Having carried out this partial operation, the assembling of the semiconductor package 32 can then be completed by fitting and fastening the optical device 53 in the front part 36 of the cavity 34.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package, comprising:
a body having a cavity closed by a lid and in which cavity an integrated-circuit chip is placed, the body having electrical connection leads that each have a resilient inner terminal part which lies in the cavity and are suitable for being in contact with electrical connection pads on the chip, the lid acting to keep the said inner terminal parts of the said leads in resilient contact with the electrical connection pads on the chip and further including a resilient member interposed between the lid and the chip.

2. The package according to claim 1, wherein the lid acts on an opposite face of the chip from a face having the said electrical connection pads.

3. The package according to claim 1, further includes a travel limitation member acting on the chip on an opposite side from the lid.

4. The package according to claim 3, wherein the travel limitation member is a part of the body.

5. The package according to claim 3, wherein the travel limitation member is a separate part from the body located in the cavity.

6. The package according to claim 1, wherein the chip has an optical sensor and the said body has a passage located facing this optical sensor, further comprising an optical device placed facing this optical sensor.

7. The package according to claim 6, wherein the optical device is placed in the cavity.

8. The package according to claim 6, wherein the said optical device and the chip are stacked between a surface of the cavity and the lid.

9. The package according to claim 6, wherein the optical device is engaged in the said cavity via its opening on an opposite side from the lid.

10. The package according to claim 9, further including a transparent plate placed between the optical device and the chip.

11. The package according to claim 1, wherein the electrical connection leads each have outer terminal parts that lie outside the said body.

12. The package according to claim 11, wherein the outer terminal parts of the electrical connection leads lie towards a rear relative to a rear face of the body.

13. The package according to claim 1, wherein the electrical connection leads each have a part that passes through the wall of the body.

14. A semiconductor package, comprising:
a body having a cavity and a retention groove;
a plurality of electrical connection leads, each lead having a resilient inner part and each lead extending through the body and into the cavity;
an integrated circuit chip positioned within the cavity, the integrated circuit chip having a plurality of electrical connection pads aligned with the plurality of electrical connection leads;
a resilient member; and
a lid for press closing an open end of the cavity to compress the resilient member against the integrated circuit chip and bias the integrated circuit pads against the resilient inner parts of the leads, the lid including a lip that engages the retention groove.

15. A semiconductor package, comprising:
a body having a cavity;
an electrical connection lead extending through the body into the cavity and terminating at a resilient end part;
an integrated circuit chip positioned within the cavity and having an electrical connection pad aligned with the electrical connection lead; and
a resilient pad; and
a lid for press closing an open end of the cavity, compressing the resilient pad against the integrated circuit chip and biasing the integrated circuit pad against the resilient end part of the lead.

16. The package of claim 15 wherein the body includes a first and a second open end, the lid press closing the first open end, and the further including an optical member positioned to close the second open end.

17. The package of claim 15 wherein the electrical connection lead extending through the body exits from the body along a side thereof.

18. The package of claim 17 wherein the side is a back side of the body near the lid.

19. The package of claim 15 further including a member to resist further movement of the integrated circuit chip in response to the biasing effectuated by the lid.

20. The package of claim 19 wherein the member is integrally formed with the body.

21. The package of claim 19 wherein the member is inserted within the cavity of the body.

22. The package of claim 15 further including a locking mechanism to mechanically secure the lid to the body.

23. The package of claim 22 wherein the locking mechanism is a tongue and groove.

* * * * *